Figure 6:
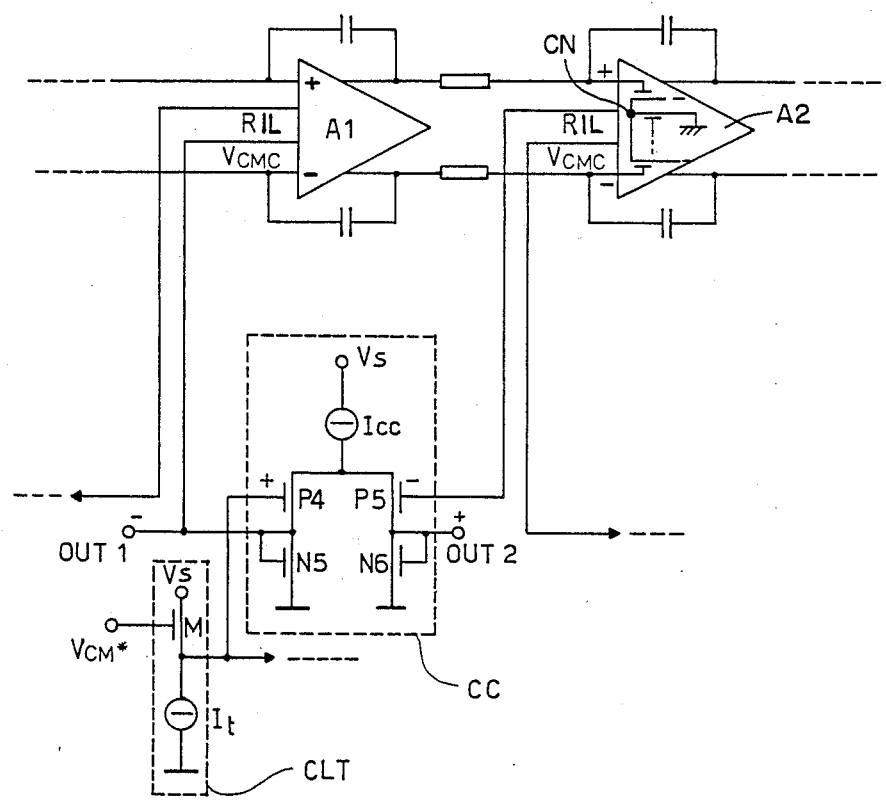

United States Patent [19]
Devecchi et al.

[11] Patent Number: 4,918,399
[45] Date of Patent: Apr. 17, 1990

[54] COMMON MODE SENSING AND CONTROL IN BALANCED AMPLIFIER CHAINS

[75] Inventors: Daniele Devecchi, Desio; Guido Torelli, Alessio, both of Italy

[73] Assignee: SGS-Thomson Microelectronics S.r.l., Agrate Brianza, Italy

[21] Appl. No.: 281,725

[22] Filed: Dec. 9, 1988

[51] Int. Cl.⁴ .............................................. H03F 3/45
[52] U.S. Cl. .................................... 330/253; 330/258
[58] Field of Search ....................... 330/69, 253, 258

[56] References Cited

U.S. PATENT DOCUMENTS 3,370,245 2/1968 Royce et al. ................. 330/69 X
4,105,942 8/1978 Henry ........................... 330/258 X

*Primary Examiner*—James B. Mullins
*Attorney, Agent, or Firm*—Pollock, Vande Sande & Priddy

[57] ABSTRACT

In a chain of fully differential amplifiers, having at least two cascaded amplifiers, the stabilization of the output common mode voltage of an amplifier is implemented by sensing the value of such a voltage by means of a dedicated terminal connected to a circuit node corresponding to the connected in common sources of the input differential pair of transistors of an amplifier which follows in the chain of cascaded amplifiers. Such a voltage is compared with a reference voltage to which, by means of a level shifting circuit, a voltage equivalent to the threshold voltage of the transistors forming the input pair is subtracted thus obtaining an error signal of the output common voltage of the amplifier to be stabilized which may be applied to a dedicated control terminal thereof. The system of the invention provides for the sensing of the output common mode voltage without loading the outputs of the amplifier to be stabilized and it is more easily implemented than known systems.

1 Claim, 2 Drawing Sheets

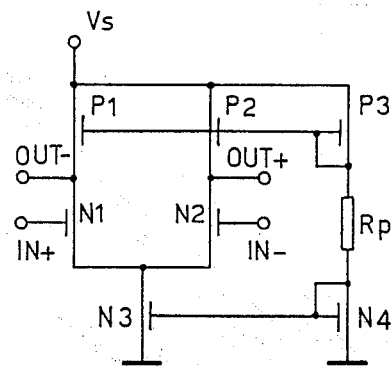
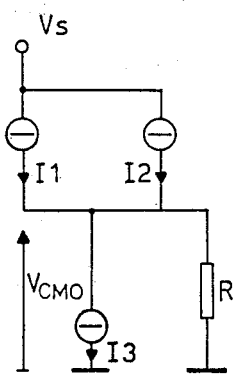
FIG.1 (prior art)          FIG.2 (prior art)
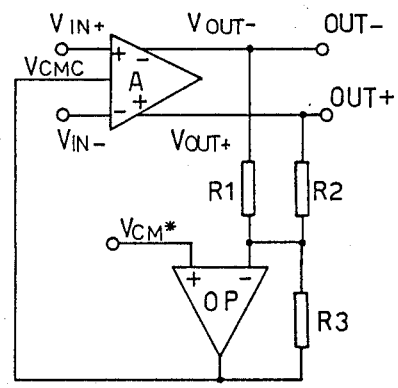
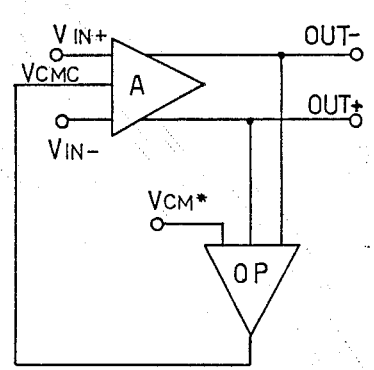
FIG.3 (prior art)          FIG.4 (prior art)
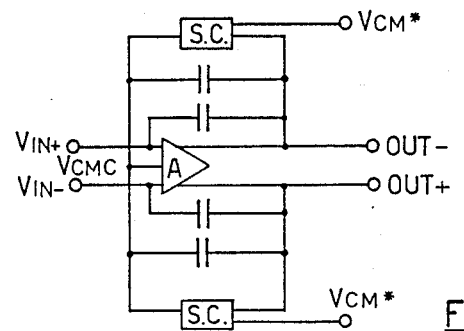
FIG.5 (prior art)

COMMON MODE SENSING AND CONTROL IN BALANCED AMPLIFIER CHAINS

BACKGROUND OF THE INVENTION

1. Field of the invention

The present invention relates to balanced amplifiers, i.e. fully differential amplifiers, and the techniques for controlling the common mode voltage.

2. Discussion of the prior art

A fully differential or balanced amplifier is represented by a four terminal amplifying block, two input terminals (the inverting and the noninverting input, respectively) and two output terminals (the positive and the negative output, respectively).

A characteristic of these amplifiers is that the usable-output voltage is not the voltage of a single output terminal with reference to a common potential node of the circuit, but the potential difference between the two output terminals. Although the value of the voltage between each output terminal and the circuit ground is not significant in relation to the useful output signal of the amplifier, such a voltage is all the same subject to certain restraints, often rather stringent, in order to ensure correct operation of the whole circuit. In fact, an anomalously different value from the design value of the voltages toward ground of the two output terminals of an amplifier may compromise the correct biasing of the input devices of a following stage as well as the correct biasing of the output transistors of the amplifier.

The terms of the problem may be better understood by referring to FIG. 1, wherein a most elementary type of balanced amplifier made with CMOS devices is depicted. The amplifier is formed by a pair of input transistors N1 and N2, by three current generators formed by transistors P1, P2 and by the transistor N3, respectively. The gates of the input transistors constitute the two input terminals IN+ and IN− of the differential amplifier and the drains of the same transistors constitute the respective nodes or output terminals OUT− and OUT+. A network for controlling the biasing currents of the differential input pair of transistors N1 and N2 is formed by two diode connected transistors P3 and N4 and by the control resistor Rp. The operation of the circuit is of immediate comprehension by a skilled technician and hardly requires further explanations. In such an amplifier the input voltage will be:

$$Vi = Vin+ - Vin-$$

while the output voltage will be:

$$Vout = Vout+ - Vout-$$

it is defined as "input common mode voltage":

$$Vcmi = \tfrac{1}{2}(Vin+ + Vin-)$$

and it is defined as "output common mode voltage":

$$Vcmo = \tfrac{1}{2}(Vout+ + Vout-).$$

In order for the amplifier of FIG. 1 to work and be able to drive a similar following amplifier stage, it is necessary for the Vcmo to be within a voltage range, the limits of which depend upon the desired output signal swing and other parameters, which are often tied to the fabrication technology of the semiconductor devices (e.g. the threshold voltages of transistors) as well as the supply voltage (Vs) of the circuit.

A correct operation of the amplifier is ensured when all transistors operate within the so-called "saturation zone". In this case the amplifier's circuit of FIG. 1 may be schematically depicted, in terms of the output common mode voltage, as shown in the circuit diagram of FIG. 2, wherein the transistors used as current generators are represented by means of the relative current generator symbol and the presence of a resistor R signifies the non-ideal reality of current generators (finite impedance) and the consequent channel modulation effect of the transistors forming the differential amplifier.

It is evident that:

$$Vcmo = R(I1 + I2 - I3).$$

It would appear simple to determine a suitable value of the output common mode voltage of the amplifier (Vcmo) by controlling the value of the resistor R and the values of the currents I1, I2 and I3.

In practice this is not possible because R is hard to control in a sufficiently precise manner; and in any case, the value of such a resistance R must be rather high in order to obtain a sufficiently high differential gain. The currents I1 and I2 (the two respective current generators) must be as identical as possible in order to reduce the "offset" voltage of the amplifier. In practice, the parameter which would appear simpler to act on is the value of the current I3, which is also hard to control with sufficient precision to ensure a desired value of the output common mode voltage Vcmo.

It is therefore common to adjust the value of the Vcmo by additional circuit means which essentially consist of feedback loops, commonly referred to as "common mode feedbacks". Such an output common mode voltage control loop of the amplifier may be implemented within the integrated amplifier itself or by external means, but in any case the problem of discriminating the common mode signal from the differential signal exists. This discriminating problem especially when the dynamic range of the output signal is of the same order of the Vcmo, may cause other problems such as, for example, a transfer of the differential signal on the common mode signal, as will be described later.

A classic solution of the problem is depicted in FIG. 3. The balanced amplifier, the output common mode voltage of which must be controlled, is indicated by the symbol A. The output common mode voltage control loop is formed by a single-ended operational amplifier, indicated by the symbol OP, connected in a summing network, which comprises the resistances R1, R2 and R3, and capable of generating an output voltage (commonly referred to as an error signal) which is proportional to:

$$Vout+ + Vout- - Vcm*$$

where Vcm* is the desired design value of the output common mode voltage Vcmo of the amplifier. Such an output voltage of the OP amplifier is used, according to techniques known to the skilled technician, by applying it to a dedicated Vcmc terminal of the balanced amplifier (output common mode control terminal) in order to control the value of the current I3, or of the currents I1 and I2 (FIG. 2), in such a way as to keep the Vcmo of the fully differential amplifier A within a correct range set by such a reference voltage Vcm*. This type of pair of input transistors is therefore available an exact replica of the output common mode voltage (Vcmo) of the preceding amplifier of the chain, less the threshold voltage (Vt) of the transistors.

In other words, on the RIL terminal of the amplifier A2 there will be available a voltage replica of the output common mode voltage Vcmo of the preceding amplifier A1.

By means of a comparator circuit CC, formed substantially by a differential input amplifier, it is possible to compare the voltage signal available on the RIL terminal of the amplifier A2 and corresponding to: $Vcmo_{A1} - Vt$, with a reference signal corresponding: $Vcm^* - Vt$, thus obtaining at the output OUT1 or at the output OUT2 of the comparative circuit CC an "error signal" of the output common mode voltage of the amplifier A1. Such a signal is then applied to the control terminal Vcmc of the output common mode voltage of the amplifier A1 in order to stabilize the output common mode voltage at a desired value, which is set by the reference voltage Vcm* which is applied to a level shifting circuit CLT which may conveniently be unique for all the control loops of the output common mode voltage of the amplifiers of the chain.

As shown in FIG. 6, the comparator circuit CC may be formed by a differential pair of P-channel transistors, P4 and P5, the gates of which represent a noninverting and an inverting input terminal, respectively, of the comparator circuit; by the relative current generators formed by the two n-channel transistors N5 and N6 and by the current generator Icc. The voltage signal available on the RIL terminal of the amplifier A2 is applied to the inverting (−) input terminal of the comparator circuit CC, while to the noninverting (+) input terminal thereof a voltage replica of the reference voltage Vcm* is applied by means of the level shifting circuit CTL. The latter is shown being formed by a current generator It and by a MOS transistor M which has necessarily the same polarity of the MOS transistors forming the input differential pair of the amplifier A2, on which the output common mode voltage of the amplifier A1 is sensed.

The embodiment depicted in FIG. 6 shows two distinct outputs, namely a positive and a negative output, of the comparator circuit CC. Case by case, only one of these outputs (−) OUT1 and (+) OUT2 will be utilized, respectively, in case the gain between the common mode control terminal and the output terminal is positive or negative, in order to implement a negative feedback capable of stabilizing the system. In the shown embodiment it is assumed that the output common mode control terminal Vcmc of the amplifier A1 is an inverting type terminal with respect to the output common mode and consequently the negative output OUT1 of the comparator circuit CC is shown as being connected to the control terminal Vcmc of the amplifier A1.

The embodiment of FIG. 6 is extremely simple and particularly efficient when the control input terminal Vcmc is connected to the gate of a MOS transistor operating as a current generator of the same type of the output MOS transistor of the comparator circuit CC because in this case the circuit operates essentially as a current mirror. In such a case it is particularly simple to size the current generator Icc and the transconductance of the comparator circuit CC in function of the known parameters of the balanced amplifier to be stabilized in order to obtain the desired degree of control over the output common mode voltage Vcmo thereof.

Of course all the amplifiers of the chain with the exception of the last one may be so stabilized by means of the system of the invention. The last amplifier of the chain may also be stabilized with the same system of the present invention by purposely providing a further suitable differential stage cascaded to the output of said last amplifier. The output common mode of the last balanced amplifier of the chain is sensed in order to implement the described stabilizing feedback. Otherwise such a last amplifier of the chain may also be stabilized by means of anyone of the techniques of the prior art which have been described previously.

In comparison to the known systems for sensing and controlling the output common mode voltage of balanced amplifiers, the solution proposed by the applicants offers the following important advantages:

the load on the outputs of the amplifier to be stabilized is not increased;

the operational amplifier required for comparing the sensed Vcmo and the reference voltage Vcm* may be extremely simple;

a portion of the control circuit, i.e. the level shifting circuit CLT, may be conveniently common for all the balanced amplifiers of the chain to be stabilized;

the implementation of the common mode control system of the invention generally does not require additional components for the frequency compensation of the stabilized amplifiers.

Although the control circuit of the invention is particularly suited to be made in CMOS technology, it may also be easily implemented in N-channel or in P-channel technology, as well as in bipolar technology.

Whenever the balanced amplifiers, the Vcmo of which must be controlled, are to function in a circuit comprising resistor networks or resistor simulating networks such as for example switched capacitor networks connected between the outputs of an amplifier and the inputs of the same amplifier, the Vcmi voltage of an amplifier will not depend exclusively from the Vcmo voltage of the preceding amplifier in the chain but, to some extent, also from the Vcmo voltage of the amplifier itself. In this case the utilization of the system of the invention may be considered case by case in function of such peculiarities of the overall circuit.

What we claim is:

1. A chain of fully differential amplifiers comprising:
   at least two amplifiers connected in cascade, each amplifier of the chain comprising an input differential pair of transistors each having a gate connected, respectively, to a first and a second input terminal of the amplifier, the respective sources of said transistors being connected in common;
   wherein at least the first or preceding one of said at least two cascaded amplifiers has two output terminals cascadedly connected to the following amplifier in the chain;
   means for sensing the output common mode voltage of said first or preceding amplifier;
   means for comparing the sensed output common mode voltage of said first or preceding amplifier with a preset reference voltage and for generating an error voltage signal proportional to the difference between said sensed output common mode voltage and said preset reference voltage; and
   means for maintaining said output common mode voltage of said first or preceding amplifier below a maximum value set by said reference voltage by applying said error signal to an output common mode voltage control terminal of said first or preceding amplifier;

wherein said sensing means, said comparing means and said means for applying said error signal comprise an electrical connection between said commonly connected sources of said input differential pair of transistors of said amplifier which follows said first or preceding amplifier in the chain of cascaded amplifiers and a first input terminal of a differential input comparator having a second input terminal to which said preset reference voltage is applied by means of a level shifting circuit; and an electrical connection between an output of said differential input comparator and said output common mode voltage control terminal of said first or preceding amplifier.

\* \* \* \* \*